(12) United States Patent
Gravelle, Jr.

(10) Patent No.: US 10,529,763 B2
(45) Date of Patent: Jan. 7, 2020

(54) IMAGING PIXELS WITH MICROLENSES

(71) Applicant: SEMICONDUCTOR COMPONENTS INDUSTRIES, LLC, Phoenix, AZ (US)

(72) Inventor: Robert Michael Gravelle, Jr., Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/957,036

(22) Filed: Apr. 19, 2018

(65) Prior Publication Data

US 2019/0326341 A1 Oct. 24, 2019

(51) Int. Cl.
*H01L 27/146* (2006.01)
*G02B 3/00* (2006.01)

(52) U.S. Cl.
CPC ...... *H01L 27/14627* (2013.01); *G02B 3/0037* (2013.01); *H01L 27/14607* (2013.01); *H01L 27/14621* (2013.01); *H01L 27/14645* (2013.01)

(58) Field of Classification Search
CPC ........ H01L 27/14627; H01L 27/14645; G02B 3/0037; G02B 3/0056; G02B 3/08
See application file for complete search history.

(56) References Cited

U.S. PATENT DOCUMENTS

| | | | | |
|---|---|---|---|---|
| 6,069,748 | A * | 5/2000 | Bietry | G02B 3/06 359/710 |
| 6,410,213 | B1 * | 6/2002 | Raguin | G03F 7/001 430/321 |
| 6,995,800 | B2 * | 2/2006 | Takahashi | H01L 27/14627 257/294 |
| 2005/0253943 | A1 | 11/2005 | Takahashi | |
| 2006/0152813 | A1 | 7/2006 | Boettiger et al. | |
| 2007/0030379 | A1 | 2/2007 | Agranov | |
| 2008/0020299 | A1 | 1/2008 | Lee | |
| 2008/0266667 | A1 | 10/2008 | Min et al. | |
| 2010/0146477 | A1 * | 6/2010 | Feng | H01L 27/14627 716/51 |
| 2011/0076001 | A1 | 3/2011 | Iwasaki | |
| 2011/0215223 | A1 | 9/2011 | Unagami et al. | |
| 2012/0139909 | A1 * | 6/2012 | Choi | G02B 27/2264 345/419 |
| 2013/0050526 | A1 * | 2/2013 | Keelan | H04N 5/2254 348/231.99 |

(Continued)

*Primary Examiner* — Cuong Q Nguyen
*Assistant Examiner* — Shuh Tsun A Chou
(74) *Attorney, Agent, or Firm* — Treyz Law Group, P.C.; Joseph F. Guihan

(57) ABSTRACT

An image sensor may include an array of pixels. Each pixel may have one or more photosensitive areas. Incident light may pass through a microlens and a color filter element to reach the one or more photosensitive areas. In some pixels, the microlens may be shifted relative to the photosensitive area to account for the chief ray angle of the incident light. In some cases, the microlenses may be toroidal microlenses with openings. The openings may be shifted relative to the center of the microlens based on the wavelength of light transmitted by the color filter element for the pixel. The greater the wavelength of light transmitted by the color filter element for a given pixel, the more the opening of the microlens may be shifted towards the center of the array of pixels.

5 Claims, 7 Drawing Sheets

(56) References Cited

U.S. PATENT DOCUMENTS

| | | |
|---|---|---|
| 2013/0087683 A1 | 4/2013 | Mo et al. |
| 2014/0055576 A1* | 2/2014 | Shibazaki .............. G03B 35/10 348/49 |
| 2015/0036029 A1* | 2/2015 | Theuwissen ........... H04N 9/045 348/273 |
| 2015/0181103 A1 | 6/2015 | Kimura |
| 2016/0118429 A1* | 4/2016 | Otsuji ............... H01L 27/14623 250/206 |
| 2016/0255289 A1 | 9/2016 | Johnson et al. |
| 2016/0276396 A1* | 9/2016 | Tayanaka .......... H01L 27/14623 |
| 2017/0059446 A1* | 3/2017 | Maeda ................ G01M 11/025 |
| 2017/0347042 A1* | 11/2017 | Borthakur .............. H04N 5/355 |

\* cited by examiner

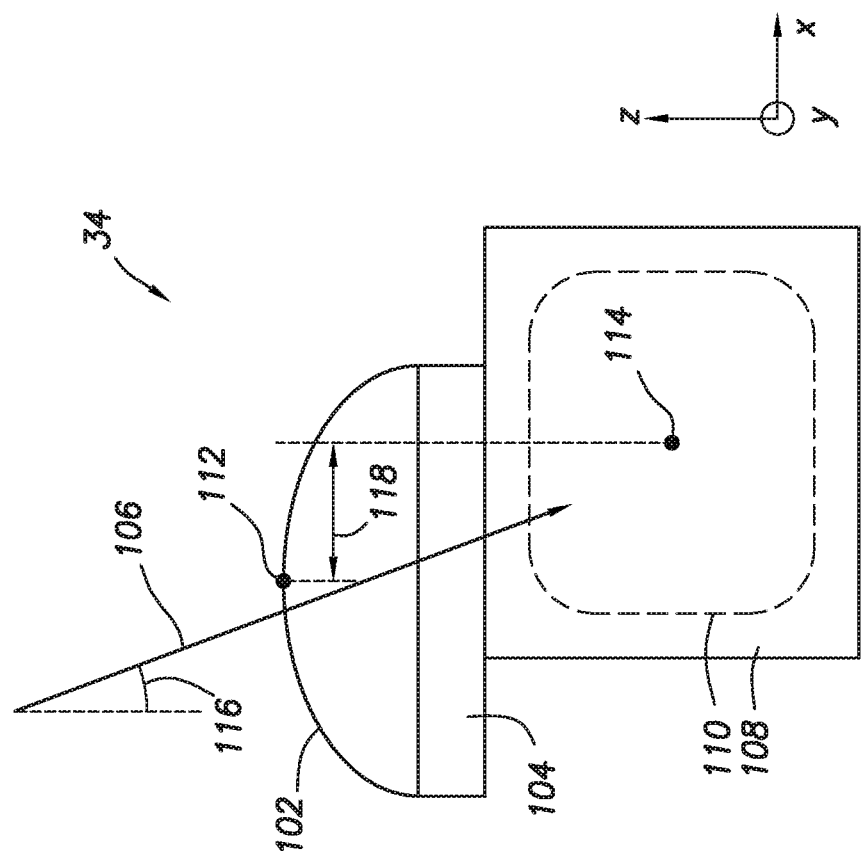
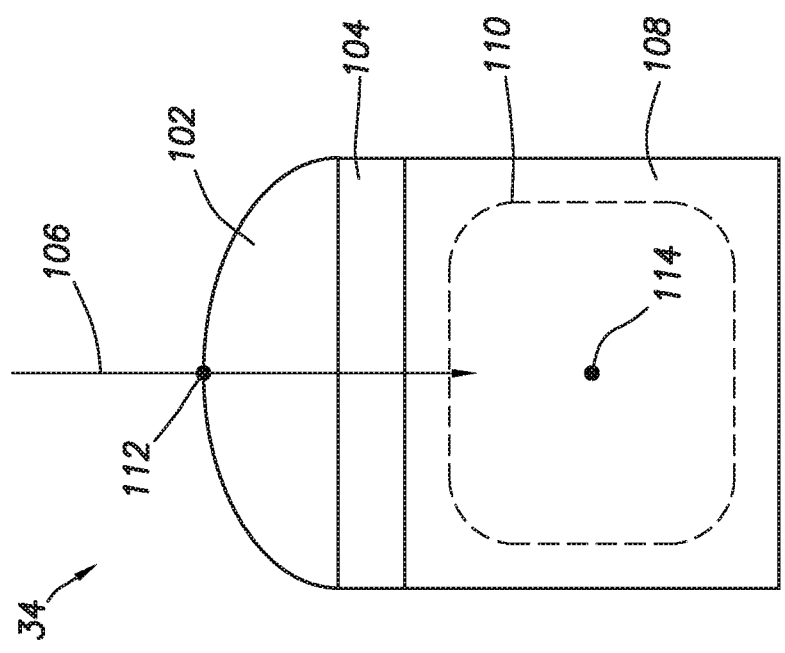
FIG.3A
FIG.3B

US 10,529,763 B2

IMAGING PIXELS WITH MICROLENSES

BACKGROUND

This relates generally to imaging devices, and more particularly, to imaging sensor pixels that include microlenses.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels.

In conventional image sensors, each pixel may include a respective microlens to focus light on that pixel's photodiode. The microlenses in the image sensor may sometimes be shifted to account for the angle of incoming incident light. However, the microlens positions of conventional image sensors do not account for the color of the underlying pixel.

It would therefore be desirable to provide improved microlens arrangements for image sensors.

BRIEF DESCRIPTION OF THE DRAWINGS

FIGS. 3A and 3B are cross-sectional side views of illustrative image pixels with microlenses showing how the microlenses may be shifted relative to the photosensitive areas of the image pixels in accordance with an embodiment.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
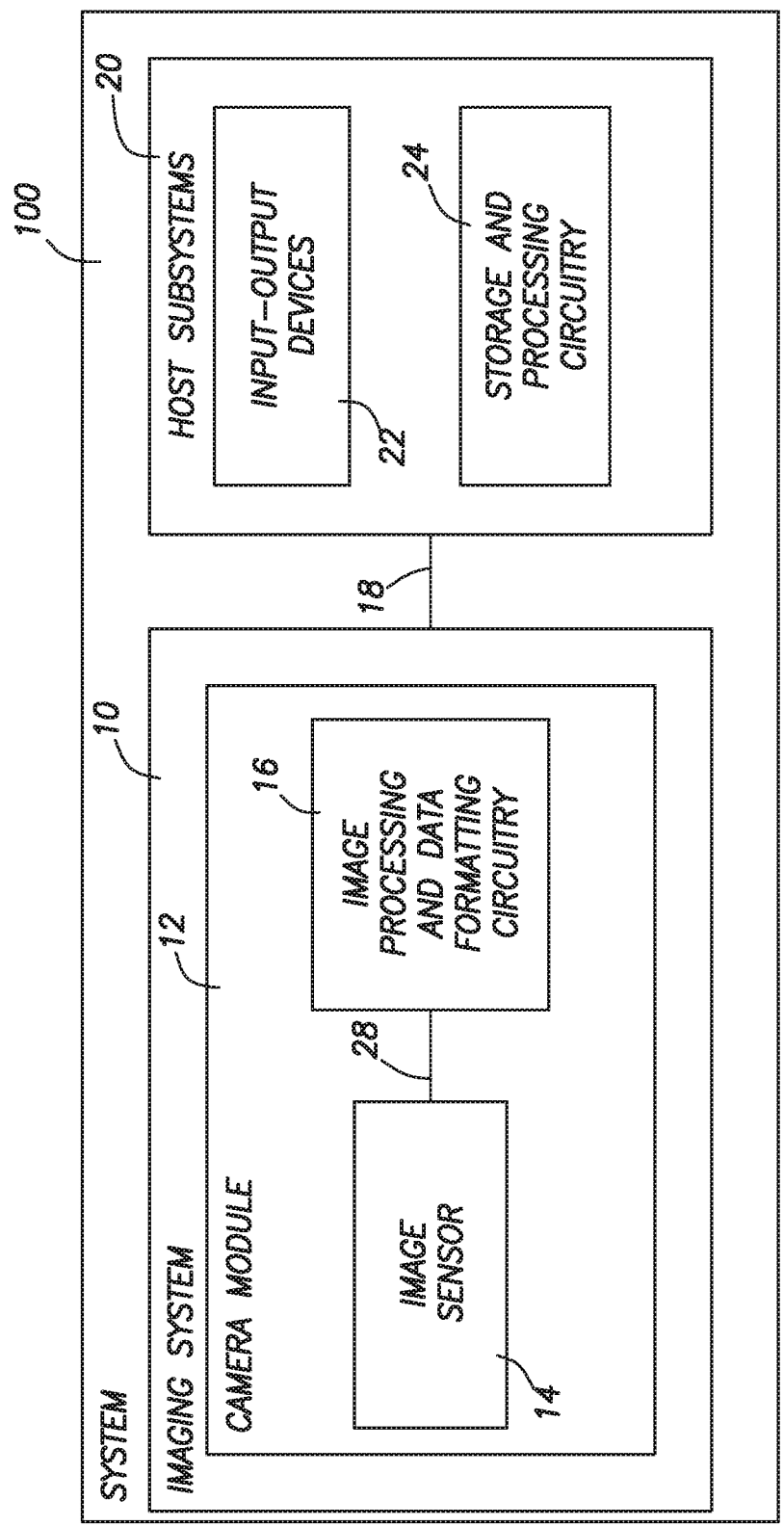
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
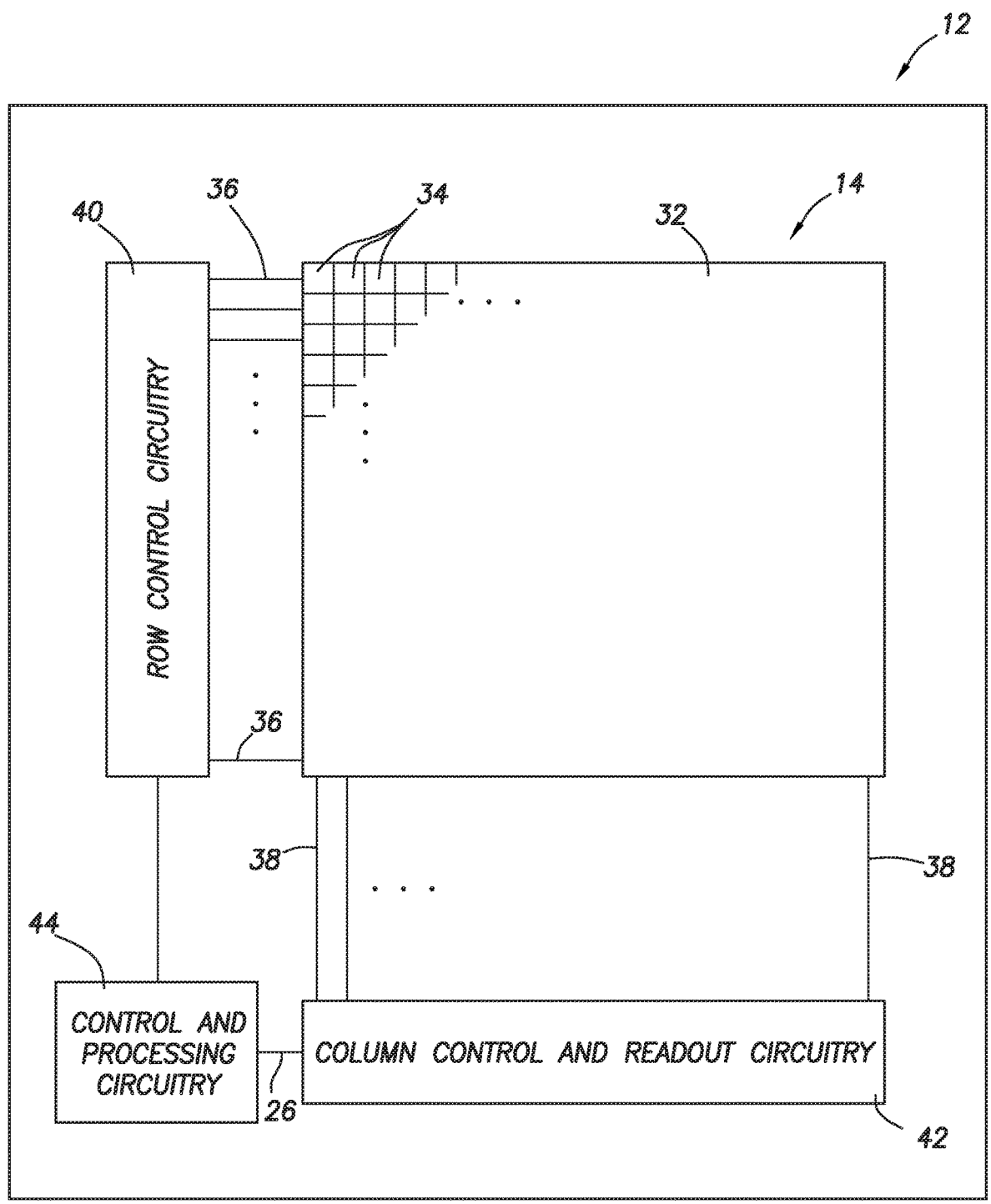
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34). Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any known metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source-follower transistor and a row select transistor, or any other desired node of the pixel circuit.

FIG. 3A is an illustrative cross-sectional view of a pixel that may be included in a pixel array such as the pixel array shown in FIG. 2. Pixel 34 may include one or more photosensitive regions such as photosensitive region 110 formed in a substrate such as silicon substrate 108. For example, the one or more photosensitive regions may include one photodiode, two photodiodes, three photodiodes, more than three photodiodes, etc. Microlens 102 may be formed over photosensitive region 110 and may be used to direct incident light 106 towards photosensitive region 110.

A color filter such as color filter element 104 may be interposed between microlens 102 and substrate 108. Color filter element 104 may filter incident light by only allowing predetermined wavelengths to pass through the color filter element 104 (e.g., color filter 104 may only be transparent to the wavelengths corresponding to a green color, a red color, a blue color, a yellow color, a cyan color, a magenta color, visible light, infrared light, etc.). Color filter 104 may be a broadband color filter. Examples of broadband color filters include yellow color filters (e.g., yellow color filter material that passes red and green light) and clear color filters (e.g., transparent material that passes red, blue, and green light). In general, broadband filter elements may pass two or more colors of light. Photosensitive area 110 may serve to absorb incident light focused by microlens 102 and produce pixel signals that correspond to the amount of incident light absorbed.

An image sensor can be formed using front side illumination image sensor arrangements (e.g., when circuitry such as metal interconnect circuitry is interposed between the microlens and photosensitive regions) or backside illumination image sensor arrangements (e.g., when photosensitive regions are interposed between the microlens and the metal interconnect circuitry). The example of FIG. 3A in which pixel 34 is a backside illuminated image sensor pixel is merely illustrative. If desired, pixel 34 may be a front side illuminated image sensor pixel. Arrangements in which pixels are backside illuminated image sensor pixels are sometimes described herein as an example.

In a pixel array, the microlenses of the pixels may be shifted to account for the angle of incident light received by the pixels. For example, the pixel in FIG. 3A may be a pixel in the center of a pixel array (e.g., in a center row and center column of array 32 in FIG. 2). Because the pixel is in the center of the pixel array, the received incident light 106 may have an angle (sometimes referred to as the chief ray angle) that is aligned with the Z-axis. Accordingly, microlens 102 may have a geometric center 112 that is aligned with the geometric center 114 of the substrate 108 for the pixel. Geometric center 112 may be the apex of the microlens (if microlens 112 has a symmetrical curved upper surface). Microlens 102 may have a circular outline when viewed from above, and geometric center 112 may be the geometric center of the circular outline of the microlens when viewed from above. The geometric center 114 of the substrate may be the geometric center of the portion of the substrate that is used to form the photosensitive area for the pixel (e.g., geometric center 114 is the geometric center of the one or more photosensitive areas for a corresponding pixel). The geometric centers 112 and 114 may be aligned as shown in FIG. 3A, meaning that the geometric centers vertically overlap (e.g., a line parallel to the Z-axis can intersect both geometric centers 112 and 114).

The example of FIG. 3A, where microlens 102 has a geometric center 112 that is aligned with geometric center 114, is merely illustrative. Pixel 34 in FIG. 3B may be a pixel at the edge of the pixel array (e.g., in a center row and right-most column of array 32 in FIG. 2). Because the pixel is at the edge of the pixel array, the received incident light 106 may be at an angle (sometimes referred to as the chief ray angle) 116 relative to the Z-axis. Accordingly, microlens 102 may have a geometric center 112 that is shifted by distance 118 relative to geometric center 114 of the pixel. This microlens shift may be used to ensure that high-angle incident light passes through the microlens and color filter element that correspond to the desired photosensitive area.

The microlens of each pixel may be shifted by any desired amount. In general, distance 118 of the microlens shift may be proportional to the distance of the pixel from the center of the pixel array. Pixels in the center of the pixel array (such as the pixel in FIG. 3A) will have no microlens shift, whereas pixels at the edge of the pixel array (such as the pixel in FIG. 3B) will have a large microlens shift. In the example of FIG. 3B, the microlens is depicted as being shifted along the X-axis (e.g., in the negative X-direction). However, this example is merely illustrative, and the microlenses may be shifted in more than one direction if desired (e.g., microlenses in the corner of the pixel array will be shifted along the X-axis and along the Y-axis).

In the cross-sectional side views of FIGS. 3A and 3B, microlenses 102 are depicted as having a curved upper surface. The microlenses of FIGS. 3A and 3B may also have a circular outline when viewed from above. These examples are merely illustrative. In general, microlenses 102 may have any desired shape. In some examples, microlenses 102 may be toroidal (e.g., donut-shaped) microlenses with a central opening. Toroidal microlenses may be useful in covering pixels that include two or more sub-pixels. Examples of this type are shown in FIGS. 4A and 4B.

Figure 4B:
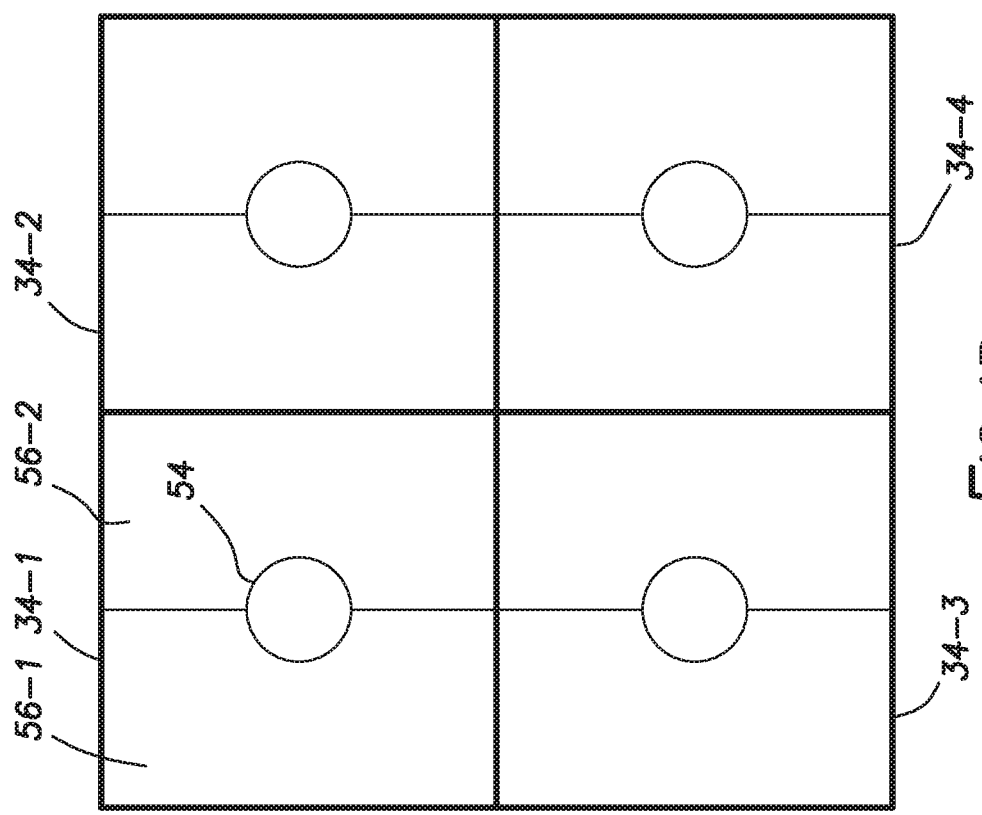
FIGS. 4A and 4B are top views showing illustrative pixel arrays where each pixel has two or more sub-pixels that each has a respective photosensitive area in accordance with an embodiment.
Figure 4A:
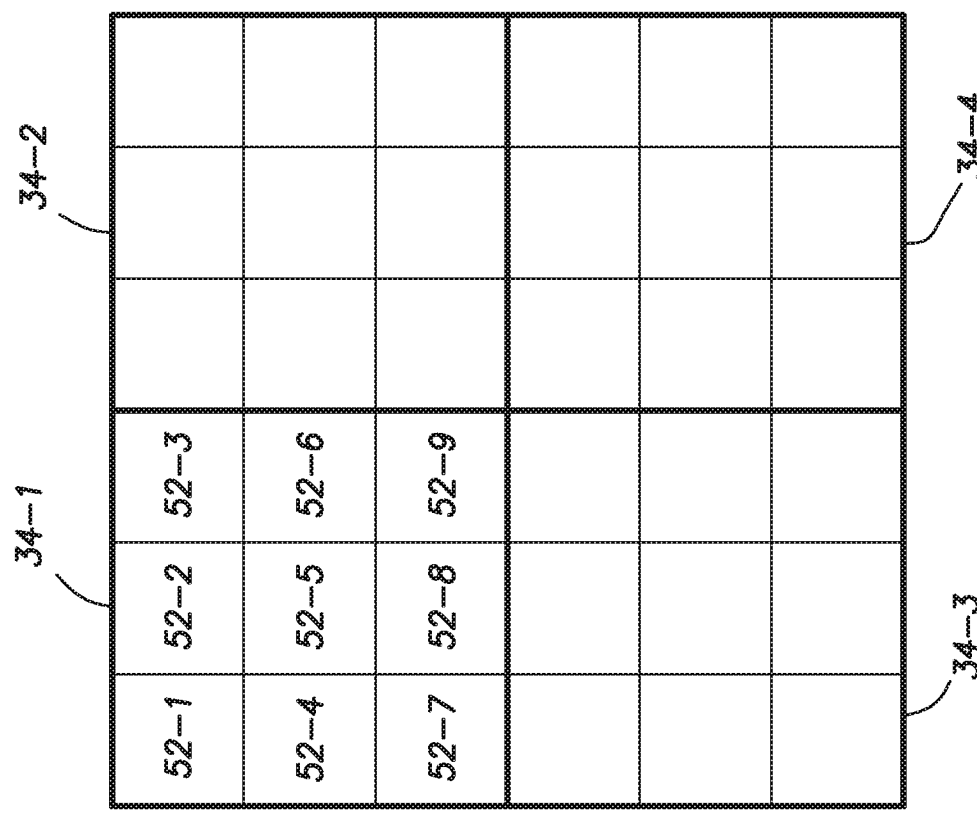

FIG. 4A is a top view of illustrative pixels with nine sub-pixels in a 3×3 arrangement that may each be covered by a toroidal microlens. Each sub-pixel may have a respective photosensitive area (e.g., photodiode). As shown in FIG. 4A, the pixels may be arranged in a 2×2 unit square that is repeated across the pixel array. For example, pixels 34-1 and 34-4 may be covered by a green color filter element, pixel 34-2 may be covered by a red color filter element, and pixel 34-3 may be covered by a blue color filter element. This pattern (e.g., a Bayer pattern) may be repeated across the pixel array. FIG. 4A also shows how each pixel 34 includes a 3×3 arrangement of sub-pixels. For example, pixel 34-1 includes sub-pixels 52-1, 52-2, and 52-3 in a top row of a 3×3 grid, sub-pixels 52-4, 52-5, and 52-6 in a middle row of a 3×3 grid, and sub-pixels 52-7, 52-8, and 52-9 in a bottom row of a 3×3 grid. All nine sub-pixels in pixel 34-1 may be covered by a color filter element of the same color (e.g., green). All of the sub-pixels of each respective pixel may be covered by a respective color filter element of a respective single color. In some applications, image data from all nine sub-pixels may be binned (summed). In other applications image data may be read separately from each respective photosensitive area of all nine sub-pixels.

Each of the pixels shown in FIG. 4A may be covered by a single toroidal microlens. The toroidal microlens may have an opening. Light that passes through the opening may reach the center sub-pixel (e.g., sub-pixel 52-5) of the pixel whereas light that enters and passes through the microlens may reach the peripheral sub-pixels (e.g., sub-pixels 52-1, 52-2, 52-3, 52-4, 52-6, 52-7, 52-8, and 52-9) of the pixel.

FIG. 4B is a top view of illustrative pixels with an inner sub-pixel surrounded by outer sub-pixels that may each be covered by a toroidal microlens. As shown in FIG. 4B, the pixels may be arranged in a 2×2 unit square that is repeated across the pixel array. For example, pixels 34-1 and 34-4 may be covered by a green color filter element, pixel 34-2 may be covered by a red color filter element, and pixel 34-3 may be covered by a blue color filter element. This pattern (e.g., a Bayer pattern) may be repeated across the pixel array. Each pixel 34 of FIG. 4B (see pixel 34-1, for example) may include a first sub-pixel 54, which may be referred to as inner sub-pixel 54. Inner sub-pixel 54 may be completely surrounded by a second sub-pixel 56-1 and a third sub-pixel 56-2, which may be referred to as outer sub-pixels 56-1 and 56-2 or may be referred to collectively as outer sub-pixel group 56. Inner sub-pixel 54 and outer sub-pixel group 56 may correspond to n-type doped photodiode regions in a semiconductor substrate. There may be respective sub-pixel circuitry in the substrate such as transfer gates, floating diffusion regions, and reset gates of each pixel 34 that is coupled to the photodiode regions in the sub-pixels 54 and 56. The semiconductor substrate (not shown) may be a bulk p-type substrate made of silicon, or any other suitable semiconductor material.

A photodiode in inner sub-pixel 54 may have a circular shape at the surface. In other words, the light collecting area of inner sub-pixel 54 is a circular region. If desired an optional isolation region may be formed between inner sub-pixel 54 and outer sub-pixels 56-1 and 56-2. The isolation region may separate individual sub-pixels in a given pixel from one another, and may also separate individual sub-pixels in different respective pixels from one another. The optional isolation region may be formed from different types of isolation devices such as trench isolation structures, doped semiconductor regions, metallic barrier structures, or any other suitable isolation device.

Because inner sub-pixel 54 is surrounded by outer sub-pixels 56-1 and 56-2, inner sub-pixel 54 may sometimes be described as being nested within outer sub-pixel group 56. Pixels 34 may sometimes be referred to as a nested image pixel. The inner sub-pixel group and the outer sub-pixel group in a nested image pixel may have the same geometric optical centers. In other words, because the outer sub-pixel group surrounds the inner sub-pixel group symmetrically, the center of the surface of the inner sub-pixel group is the same as the center of the outer sub-pixel group that surrounds the inner sub-pixel group.

The inner sub-pixel 54 may have a lower sensitivity to incident light, and may be referred to as having a lower sensitivity light collecting area compared to outer sub-pixels 56-1 and 56-2. The respective doping concentrations of inner sub-pixel 54 and outer sub-pixels 56-1 and 56-2 may be different or they may be the same. As an example, the doping concentrations of photodiode regions in inner sub-pixel 54 may be modified to reduce the sensitivity of inner sub-pixel 54 to light. The lower sensitivity to incident light of inner sub-pixel 54 compared to outer sub-pixel group 56 may be a result of the lower light collecting area of inner sub-pixel 54 compared to the light collecting area of outer sub-pixel group 56. The ratio of the light sensitivity of the outer sub-pixel group to the light sensitivity of the inner sub-pixel may be at least 4 to 1, but could be 5 to 1, 10 to 1, any intermediate ratio, or any larger ratio. In other words, the light sensitivity of the outer sub-pixel group may be at least four times greater than the light sensitivity of the inner sub-pixel group.

Because a larger amount of light incident on each pixel 34 in FIG. 4B is directed to outer sub-pixel group 56 than to inner sub-pixel 54, inner sub-pixel 54 is said to have a lower sensitivity light collecting area compared to outer sub-pixel group 56. The difference in sensitivity to light of inner sub-pixel 54 and outer sub-pixel group 56 enables pixel 34 to be used in high dynamic range applications while using the same integration time for each sub-pixel. If desired, the integration time for each sub-pixel may be different to further increase the dynamic range of the pixel.

Each of the pixels shown in FIG. 4B may be covered by a single toroidal microlens. The toroidal microlens may have an opening. Light that passes through the opening may reach the inner sub-pixel (e.g., sub-pixel 54) of the pixel whereas light that enters and passes through the microlens may reach the outer sub-pixels (e.g., sub-pixels 56-1 and 56-2) of the pixel.

Figure 5:
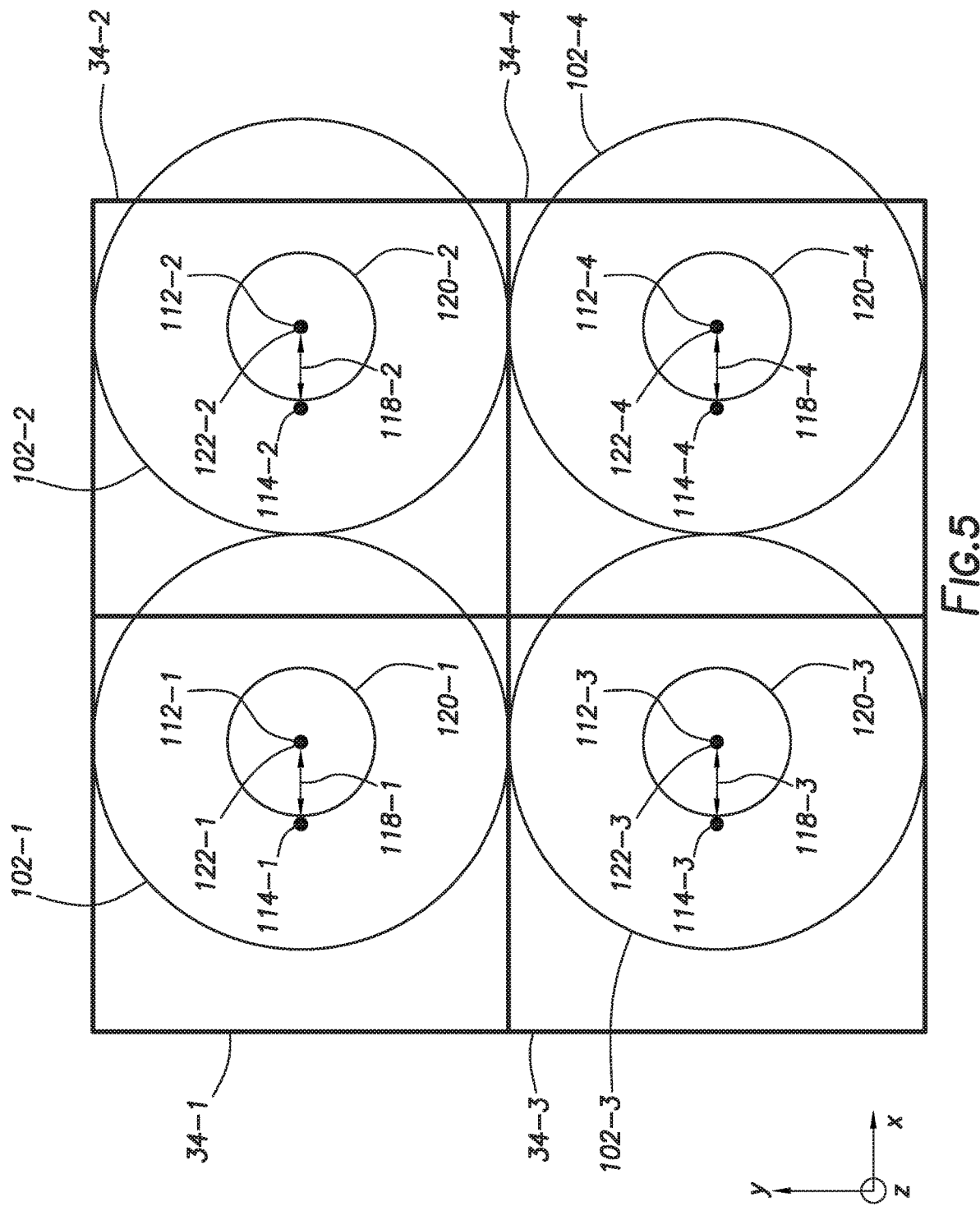
FIG. 5 is a top view of an illustrative pixel array with toroidal microlenses that are shifted relative to the underlying photosensitive areas in accordance with an embodiment.

FIG. 5 is a top view of illustrative pixels covered by toroidal microlenses. Pixel 34-1 may include a green color filter element, pixel 34-2 may include a red color filter element, pixel 34-3 may include a blue color filter element, and pixel 34-4 may include a green color filter element. Each pixel may include any desired arrangement of one or more photosensitive areas (e.g., the arrangement of FIG. 4A, the arrangement of FIG. 4B, or another desired arrangement). As shown in FIG. 5, pixel 34-1 is covered by a respective microlens 102-1, pixel 34-2 is covered by a respective microlens 102-2, pixel 34-3 is covered by a respective microlens 102-3, and pixel 34-4 is covered by a respective microlens 102-4. Each microlens has a respective opening (sometimes referred to as a hole or recess). As shown, microlens 102-1 has a respective opening 120-1, microlens 102-2 has a respective opening 120-2, microlens 102-3 has a respective opening 120-3, and microlens 102-4 has a respective opening 120-4.

As discussed in connection with FIGS. 3A and 3B, each microlens may have a respective geometric center that is shifted with respect to the geometric center of the pixel. As shown in FIG. 5, microlens 102-1 has a geometric center 112-1 that is shifted by distance 118-1 relative to the center 114-1 of the pixel. Microlens 102-2 has a geometric center 112-2 that is shifted by distance 118-2 relative to the center 114-2 of the pixel. Microlens 102-3 has a geometric center 112-3 that is shifted by distance 118-3 relative to the center 114-3 of the pixel. Microlens 102-4 has a geometric center 112-4 that is shifted by distance 118-4 relative to the center 114-4 of the pixel. The distance 118 for each pixel (from the center of the microlens to the center of the pixel) may be proportional to the distance of the microlens from the center of the pixel array (and may be independent of color of the pixel).

In the embodiment of FIG. 5, each opening has a respective geometric center that is the same as the geometric center of the microlens as a whole (e.g., the outer perimeter of the microlens and the inner perimeter of the microlens that defines the opening are concentric circles). In other words, opening 120-1 of microlens 102-1 has a geometric center 122-1 that is the same as the geometric center 112-1. Opening 120-2 of microlens 102-2 has a geometric center 122-2 that is the same as the geometric center 112-2. Opening 120-3 of microlens 102-3 has a geometric center 122-3 that is the same as the geometric center 112-3. Opening 120-4 of microlens 102-4 has a geometric center 122-4 that is the same as the geometric center 112-4.

The embodiment of FIG. 5 where the geometric center of each microlens is the same as the geometric center of each microlens opening is merely illustrative. If desired, the geometric center of the microlens opening may be shifted relative to the geometric center of the microlens. Shifting the geometric center of the microlens may help tune the response of the underlying pixel to incident light. In particular, pixels of different colors (e.g., with color filter elements that transmit different colors) may have different optimal microlens arrangements. In general, the longer the wavelength of incident light, the further into the silicon substrate the light will penetrate. For example, green light (with an illustrative wavelength of 540 nanometers) may penetrate further into the silicon substrate than blue light (with an illustrative wavelength of 470 nanometers), and red light (with an illustrative wavelength of 670 nanometers) may penetrate further into the silicon substrate than green light. Because of these differences, it may be optimal to shift microlenses and/or microlens openings by different amounts based on color. For example, it may be desirable to shift microlenses for red pixels (e.g., shift the geometric center of the microlenses relative to the geometric center of the pixel) more than microlenses for green pixels. It may be desirable to shift microlenses for blue pixels less than microlenses for green pixels. Due to manufacturing constraints, shifting the microlens centers by different amounts may be difficult. However, shifting the geometric center of the microlens opening relative to the geometric center of the microlens may require just changing the layout masks for the deposition of the microlens material and may improve pixel performance.

Figure 6:
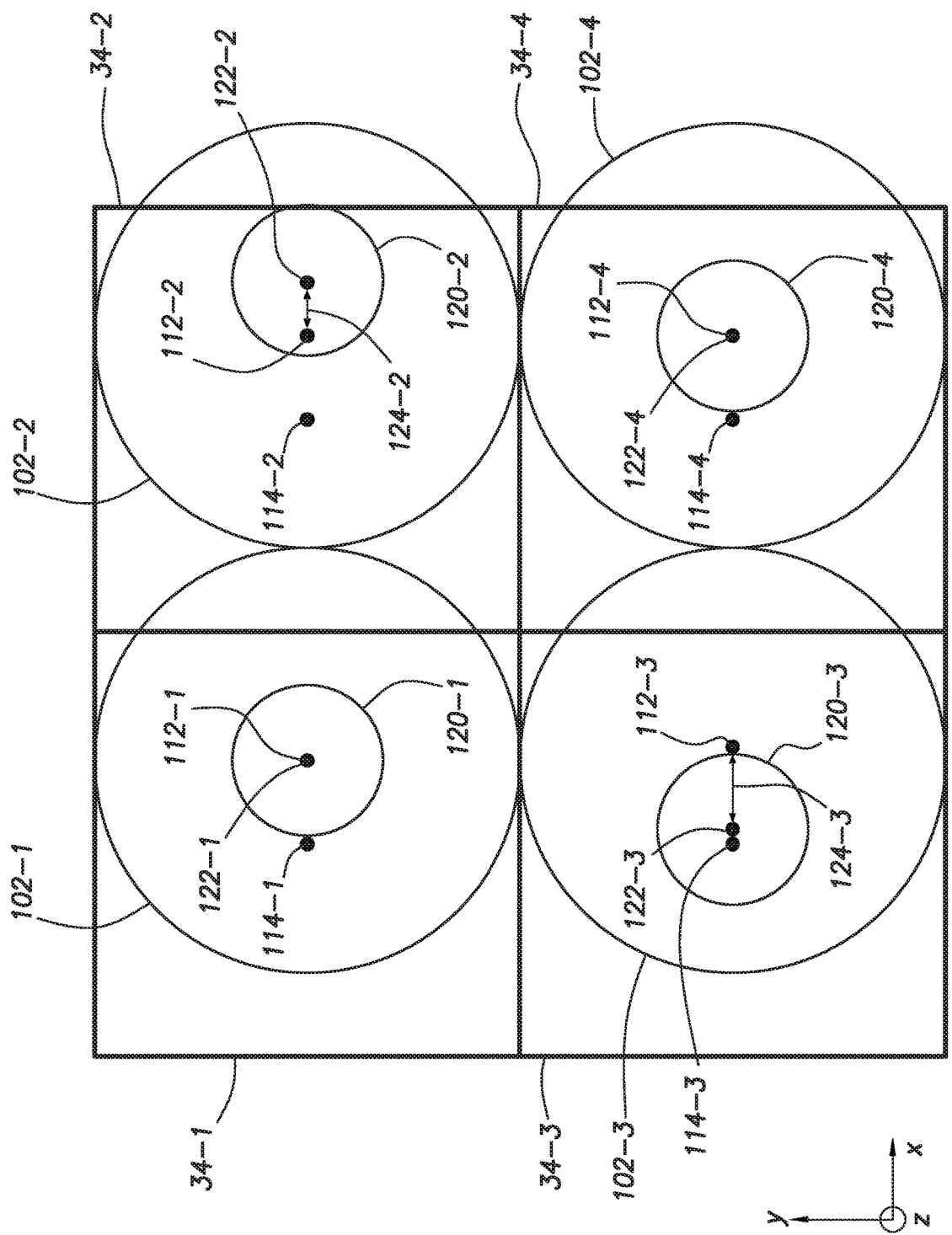
FIG. 6 is a top view of an illustrative pixel array with toroidal microlenses that are shifted relative to the underlying photosensitive areas and that have openings that are shifted based on the type of pixel in accordance with an embodiment.

FIG. 6 is a top view of illustrative pixels covered by toroidal microlenses. In FIG. 6, the microlens openings are shifted relative to the centers of the microlenses based on the color of the pixel. Pixel 34-1 may include a green color filter element, pixel 34-2 may include a red color filter element, pixel 34-3 may include a blue color filter element, and pixel 34-4 may include a green color filter element. Each pixel may include any desired arrangement of one or more photosensitive areas (e.g., the arrangement of FIG. 4A, the arrangement of FIG. 4B, or another desired arrangement). As shown in FIG. 6, similar to FIG. 5, pixel 34-1 is covered by a respective microlens 102-1, pixel 34-2 is covered by a respective microlens 102-2, pixel 34-3 is covered by a respective microlens 102-3, and pixel 34-4 is covered by a respective microlens 102-4. Each microlens has a respective opening (sometimes referred to as a hole or recess).

Each microlens may have a respective geometric center that is shifted with respect to the geometric center of the pixel. Similar to FIG. 5, the distance from the center of the microlens to the center of the pixel for each pixel in FIG. 6 may be proportional to the distance of the microlens from the center of the pixel array (and may be independent of color).

In the embodiment of FIG. 6, each opening has a respective geometric center. Opening 120-1 of microlens 102-1 has a geometric center 122-1. Opening 120-2 of microlens 102-2 has a geometric center 122-2. Opening 120-3 of microlens 102-3 has a geometric center 122-3. Opening 120-4 of microlens 102-4 has a geometric center 122-4. The geometric center of each opening is shifted relative to the geometric center of the microlens based on the color of the pixel. As shown in FIG. 6, the center 122-2 of opening 120-2 of the red pixel 34-2 is shifted by distance 124-2 relative to the center 112-2 of the microlens 102-2. The center 122-2 is shifted further from the center of the pixel than the center of the microlens (e.g., distance 124-2 extends in a direction away from center 114-2 not towards center 114-2). The center 122-3 of opening 120-3 of the blue pixel 34-3 is shifted by distance 124-3 relative to the center 112-3 of the microlens 102-3. The center 122-3 is shifted closer to the center of the pixel than the center of the microlens (e.g., distance 124-3 extends in a direction that is towards center 114-3 not away from center 114-3).

The center 122-1 of opening 120-1 of the green pixel 34-1 is not shifted relative to the center 112-1 of the microlens 102-1 (e.g., center 122-1 and 112-1 are the same). Center 122-1 of opening 120-1 may also be described as being shifted by a distance of 0 relative to center 112-1 of the microlens 102-1. The same applies to green pixel 34-4.

To summarize, the distance between the center of the pixel and the center of each microlens is determined only by the location of the pixel relative to the center of the pixel array in FIG. 6. However, the distance between the center of the pixel and the center of the opening of each microlens is proportional to the wavelength of light for that pixel (in addition to the location of the pixel relative to the center of the pixel array). Blue light has the shortest wavelength (compared to green light and red light) and accordingly blue pixel 34-3 has the smallest distance between center 114-3 and center 122-3. Green light has a longer wavelength than blue light and accordingly green pixels 34-1 and 34-4 have a greater distance between center 114-1 and center 122-1 (or center 114-4 and center 122-4). Red light has an even longer wavelength than green light and accordingly red pixel 34-2 has an even greater distance between center 114-2 and center 122-2.

The example of FIG. 6 of red, green, and blue pixels is merely illustrative. This principal (of the distance between the center of the pixel and the center of the opening of each microlens being proportional to the wavelength of light for that pixel for a given location in the array) may be applied to other types of pixels as well. For example, infrared or near-infrared pixels may have openings shifted even more than red pixels, whereas ultraviolet pixels may have openings shifted less than the blue pixels.

Additionally, the example of FIG. 6 of the microlens opening being shifted based on the color of the underlying pixel is merely illustrative. In general, any desired microlens feature may be shifted or changed (e.g., resized or reshaped) based on the color of the underlying pixel. In FIG. 6 the microlens has a hole (e.g., an opening that extends completely through the microlens). However, the microlens may instead have a recess that extends only partially through the microlens. In yet another embodiment, the microlens may have a protrusion. These types of microlens features may be shifted or changed based on the color of the underlying pixel.

The example of the distance between the center of the pixel and the center of the opening of each microlens being proportional to the wavelength of light for that pixel for a given location in the array is merely illustrative. In general, any desired microlens feature may be shifted in any desired manner based on the type of pixel (e.g., the wavelength of incident light passed by the color filter for that pixel).

For example, the size of the hole in the center of the toroidal microlens may be changed based on the wavelength of incident light passed by the color filter for that pixel. The holes may have a diameter that varies based on the color of the underlying color filter element. The size of the holes may also be selected to control how much light is directed to the inner sub-pixel of the underlying pixel compared to how much light is directed to the outer sub-pixels of the underlying pixel (e.g., how much light is directed towards or away from the center of the pixel).

Figure 7:
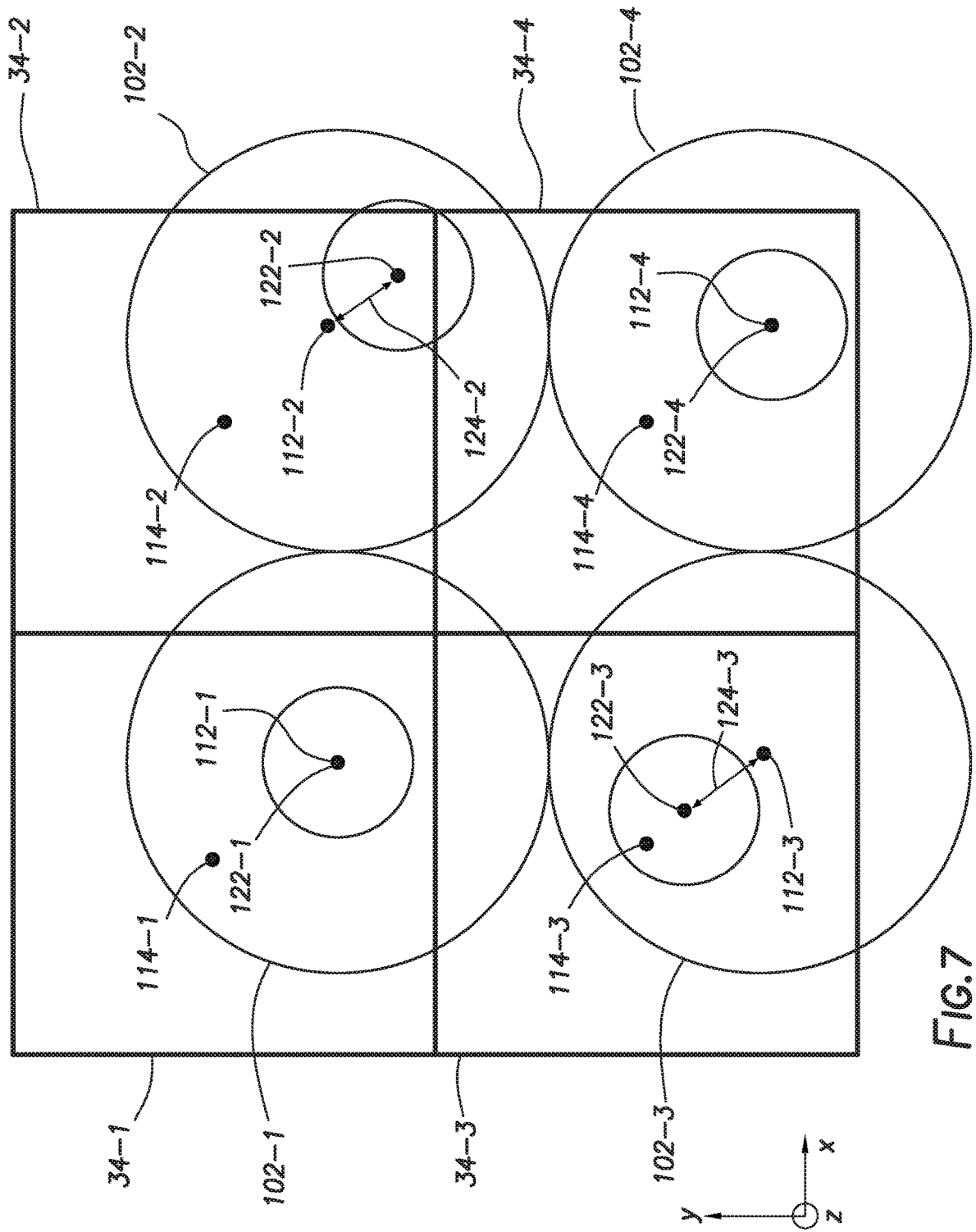
FIG. 7 is a top view of an illustrative pixel array with toroidal microlenses that are shifted relative to the underlying photosensitive areas and that have openings that are shifted in two directions based on the type of pixel in accordance with an embodiment.

In FIGS. 5 and 6, the microlenses are only depicted as being shifted along the X-axis (e.g., in the positive X-direction). This example may correspond to pixels positioned in the left-most column of the pixel array and a center row of the pixel array (FIG. 2), for example. However, this example is merely illustrative, and the microlenses may be shifted in more than one direction if desired. FIG. 7 shows pixels having microlenses that are shifted along the X-axis and along the Y-axis. The pixels of FIG. 7 may be in the upper-left corner of the pixel array of FIG. 2, for example. As shown in FIG. 7, the same pattern of shifting as in FIG. 6 holds for FIG. 7. However, the shift occurs along both the X-axis and Y-axis.

In FIG. 7, the distance between the center of the pixel and the center of each microlens is determined only by the location of the pixel relative to the center of the pixel array. However, the distance between the center of the pixel and the center of the opening of each microlens is proportional to the wavelength of light for that pixel (in addition to the location of the pixel relative to the center of the pixel array). Blue light has the shortest wavelength (compared to green light and red light) and accordingly blue pixel 34-3 has the smallest distance between center 114-3 and center 122-3. Green light has a longer wavelength than blue light and accordingly green pixels 34-1 and 34-4 have a greater distance between center 114-1 and center 122-1 (or center 114-4 and center 122-4). Red light has an even longer wavelength than green light and accordingly red pixel 34-2 has an even greater distance between center 114-2 and center 122-2.

In conclusion, each pixel in a given pixel array may be covered by a respective microlens. The microlens for each pixel may be shifted relative to the center of its pixel based on the position of the microlens within the array. In general, the microlens for each pixel may be shifted towards the center of the array (by an amount that is proportional to the distance of the microlens to the center of the array). Additionally, each microlens may have a feature such as a recess or opening. In one possible arrangement, the opening for each microlens may be in the center of its microlens (as in FIG. 5). In another possible arrangement, the opening for each microlens may be shifted relative to the center of its microlens based on the type of pixel (as in FIGS. 6 and 7). The shift between the microlens openings and the pixel centers may be proportional to the wavelength of light for the given pixel.

In various embodiments, an image sensor may include a first imaging pixel where the first imaging pixel includes a first microlens formed over at least a first photosensitive area, the first microlens has a first geometric center, the first microlens has a first opening with a second geometric center, and the first and second geometric centers are separated by a first distance and a second imaging pixel adjacent to the first imaging pixel, where the second imaging pixel includes a second microlens formed over at least a second photosensitive area, the second microlens has a third geometric center, the second microlens has a second opening with a fourth geometric center, and the third and fourth geometric centers are separated by a second distance that is different than the first distance.

The first imaging pixel includes a first color filter element of a first color between the first microlens and the at least first photosensitive area, the second imaging pixel includes a second color filter element of a second color between the second microlens and the at least second photosensitive area, and the first and second colors are different. The first color may be red and the second color may be blue. The second geometric center may be shifted relative to the first geometric center by the first distance in a first direction and the fourth geometric center may be shifted relative to the third geometric center by the second distance in a second direction that is different than the first direction. The at least first photosensitive area may include an inner photosensitive area surrounded by at least one outer photosensitive area. The inner photosensitive area may be configured to receive incident light that passes through the first opening of the first microlens and at least one outer photosensitive area may be configured to receive incident light that passes through the first microlens. The at least first photosensitive area may comprise a 3×3 grid of photosensitive areas. The first and second microlenses may be first and second toroidal microlenses.

In various embodiments, an image sensor may include an array of pixels and each pixel in the array of pixels may include at least one photosensitive area, a color filter formed over the at least one photosensitive area that is configured to transmit a given type of light, and a microlens having an opening, where the microlens has a first geometric center and the opening has a second geometric center and the second geometric center is shifted relative to the first geometric center based on the given type of light transmitted by the color filter.

The color filter of some of the pixels in the array of pixels is a red color filter and the second geometric center of each pixel with the red color filter is shifted relative to the first geometric center towards a center of the array of pixels. The color filter of some of the pixels in the array of pixels is a blue color filter and the second geometric center of each pixel with the blue color filter is shifted relative to the first geometric center away from the center of the array of pixels.

In various embodiments, an image sensor may include an array of pixels with a center and the array of pixels may include a first imaging pixel having a first geometric center and comprising at least a first photosensitive area, a first color filter element formed over the at least first photosensitive area that passes light of a first wavelength, and a first toroidal microlens formed over the first color filter element, where the first toroidal microlens has a first opening with a second geometric center that is shifted away from the first geometric center towards the center of the array of pixels by a first distance, and a second imaging pixel having a third geometric center and comprising at least a second photosensitive area, a second color filter element formed over the at least second photosensitive area that passes light of a second wavelength that is longer than the first wavelength, and a second toroidal microlens formed over the second color filter element, where the second toroidal microlens has a second opening with a fourth geometric center that is shifted away from the third geometric center towards the center of the array of pixels by a second distance that is greater than the first distance.

The first color filter element may be a blue color filter element and the second color filter element may be a green color filter element. The second color filter element may be an infrared color filter element. The first toroidal microlens may have a fifth geometric center that is shifted towards the center of the array of pixels relative to the first geometric center and the second toroidal microlens may have a sixth geometric center that is shifted towards the center of the array of pixels relative to the third geometric center.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor comprising an array of pixels with a center, wherein the array of pixels comprises:
   a first imaging pixel having a first geometric center and comprising:
      at least a first photosensitive area;
      a first color filter element formed over the at least first photosensitive area that passes light of a first wavelength; and
      a first toroidal microlens formed over the first color filter element, wherein the first toroidal microlens has a first opening with a second geometric center that is shifted away from the first geometric center towards the center of the array of pixels by a first distance; and
   a second imaging pixel having a third geometric center and comprising:
      at least a second photosensitive area;
      a second color filter element formed over the at least second photosensitive area that passes light of a second wavelength, wherein the second wavelength is longer than the first wavelength; and
      a second toroidal microlens formed over the second color filter element, wherein the second toroidal microlens has a second opening with a fourth geometric center that is shifted away from the third geometric center towards the center of the array of pixels by a second distance that is greater than the first distance.

2. The image sensor defined in claim 1, wherein the first color filter element is a blue color filter element and the second color filter element is a green color filter element.

3. The image sensor defined in claim 1, wherein the second color filter element is an infrared color filter element.

4. The image sensor defined in claim 1, wherein the first toroidal microlens has a fifth geometric center that is shifted towards the center of the array of pixels relative to the first geometric center.

5. The image sensor defined in claim 4, wherein the second toroidal microlens has a sixth geometric center that is shifted towards the center of the array of pixels relative to the third geometric center.

\* \* \* \* \*